(12) United States Patent
Yang et al.

(10) Patent No.: US 6,776,622 B2
(45) Date of Patent: Aug. 17, 2004

(54) CONDUCTIVE CONTACT STRUCTURE AND PROCESS FOR PRODUCING THE SAME

(75) Inventors: Shih-Hsien Yang, Hsinchu (TW); Yueh-Cheng Chuang, Hsinchu (TW); Bor-Ru Sheu, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/205,449

(22) Filed: Jul. 26, 2002

(65) Prior Publication Data

US 2004/0018754 A1 Jan. 29, 2004

(51) Int. Cl.[7] .......................... H05K 1/00; H01R 12/00
(52) U.S. Cl. ........................................ 439/68; 257/698
(58) Field of Search ...................... 439/68, 69; 257/698

(56) References Cited

U.S. PATENT DOCUMENTS

| | | | | |
|---|---|---|---|---|
| 5,838,049 A | * | 11/1998 | Nicholls et al. | 257/383 |
| 6,133,628 A | * | 10/2000 | Dawson | 257/698 |
| 6,522,013 B1 | * | 2/2003 | Chen et al. | 257/774 |
| 2002/0163057 A1 | * | 11/2002 | Bulovic et al. | 257/529 |
| 2002/0163072 A1 | * | 11/2002 | Gupta et al. | 257/698 |
| 2002/0195638 A1 | * | 12/2002 | Fechner et al. | 257/301 |
| 2003/0015732 A1 | * | 1/2003 | Park | 257/200 |

* cited by examiner

*Primary Examiner*—Michael C. Zarroli
(74) *Attorney, Agent, or Firm*—Dickinson Wright PLLC

(57) ABSTRACT

A conductive contact structure to electrically connect to a source/drain region in a semiconductor substrate and a process of making the same. An inlay opening including a pad opening and a bottom opening is formed in the dielectric layer on the semiconductor substrate. The pad opening is larger than and located upon the bottom opening that exposes the source/drain region. The bottom opening and pad opening are sequentially filled with a polysilicon layer and a tungsten layer to form a bottom plug and a metal pad layer, respectively.

18 Claims, 2 Drawing Sheets

CONDUCTIVE CONTACT STRUCTURE AND PROCESS FOR PRODUCING THE SAME

FIELD OF THE INVENTION

The present invention relates to a semiconductor structure and process, and more particularly to a conductive contact structure and a process thereof, which can reduce the resistance of the contact structure.

BACKGROUND OF THE INVENTION

Recently, along with progressive micro-sizing of semiconductor devices, wirings are getting more and more multi-layered when manufacturing semiconductor devices. As a result, steps in the manufacturing process of contact plugs or via plugs (generically called "contact plugs" hereinafter) are increasing, and manufacturing process of semiconductor devices are getting more and more complex.

A connection between a conductive region of an impurity diffused layer in a semiconductor substrate and an upper level wiring layer through a contact plug formed in an interlayer insulating film is one of the important fabrication techniques in a semiconductor device. As the degree of the integration density of integrated circuit device increases, contact openings for the contact plugs formed in the insulating layer are required to have a small opening size to ensure a high density device. In order to increase alignment margins between contact openings and overlying conductors, it is necessary that the critical dimension of the contact openings be reduced.

As decreases of critical dimensions of the contact openings continue, alignment tolerance of the photolithography process for fabricating the contact openings are relatively reduced. Therefore, higher precise control is required to prevent yield losses caused by misalignment errors, but this increased precision results in more manufacturing difficulty. It is necessary to develop a new advanced process having high alignment tolerance even under a lowered critical dimension.

Moreover, in the condition of minimizing critical dimension and the raising of wiring layers, the aspect ratio of the contact openings is increased, and this makes for more difficulty in filling the contact opening with conductive material. In the resulting contact plugs, voids are inevitably formed so that the resistance of the contact plugs is increased, and even a current short is created therein. Hence, operation speed of the devices is undeniably decreased, or failure-prone devices are unavoidably produced. Furthermore, the contact openings are traditionally filled with polysilicon to form contact plugs. Although the ohmic resistance in the bottom of the contact plane can be reduced, unfortunately, a native silicon oxide layer is naturally formed. In order to remove the native silicon oxide layer, a wet cleaning process is employed so that the neighboring silicon-based dielectric layer is damaged, and thus modifies the original size of the contact openings.

SUMMARY OF THE INVENTION

It is an object of the present invention to provide a conductive contact structure and process that decreases the aspect ratio of the contact openings and prevents formation of the voids in the contact plugs.

It is another object of the present invention to provide a conductive contact structure and process that can reduce the resistance of the contact structure and increase the operation speed of devices by utilizing the metal pad layer.

It is yet a further object of the present invention to provide a conductive contact structure and process that uses a metal pad layer without a native silicon oxide layer. The size of the contact openings above the metal pad will not be changed since there is no native silicon oxide layer is required to be removed.

In one aspect, the present invention provides a method of fabricating a conductive contact structure for electrically connecting to a source/drain region in a semiconductor substrate having a first dielectric layer thereon covering the source/drain region. The method comprises the following steps. A pad opening and a bottom opening are formed in the first dielectric layer. The pad opening is larger than and located upon the bottom openings to expose the source/drain region. The bottom opening and pad opening are filled with a polysilicon layer and a first metal layer, respectively. A second dielectric layer is formed on the first dielectric layer, and a top opening is formed therein. The top opening substantially shifting away from the bottom opening is smaller than and located upon the pad opening to expose the metal layer. The top opening is then filled with a second metal layer.

In another aspect, the present invention provides a conductive contact structure in a dielectric layer located on a semiconductor substrate to electrically connect to a source/drain region in the semiconductor substrate. The conductive contact structure comprises a bottom plug, a metal pad layer and a top plug. The bottom plug is disposed on and electrically connected to the source/drain region. The metal pad layer having a shape of bar is larger than the bottom plug. One end of the metal pad layer is disposed on and electrically connected to the bottom plug. The top plug is disposed on and electrically connected to the metal pad layer. The top plug has a location substantially shifted away from the bottom plug.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a conductive contact structure and process, in which a larger area of a metal pad layer is formed between a bottom plug and a top plug. The aspect ratio of the contact openings for the conductive contact structure can be decreased. The alignment process window of photolithography process for the contact openings can be increased to reduce yield losses caused by misalignment errors. Moreover, the resistance of the contact structure can be decreased because of the metal pad layer. Even a native metal oxide layer is formed on the surface, the size of the contact openings above the metal pad layer will not be changed during the process of removing the metal oxide layer.

Figure 1:
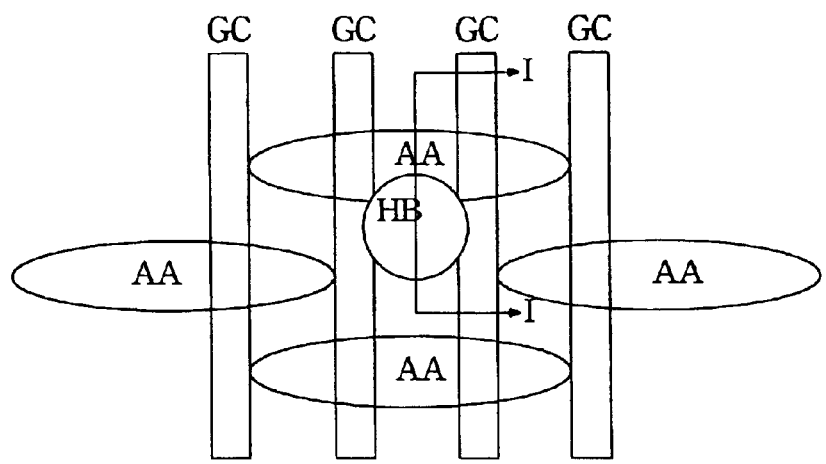
FIG. 1 is a schematic layout according to one preferred embodiment of the present invention.

Referring to FIG. 1, a schematic layout according to one preferred embodiment of the present invention is shown.

This layout is adapted for a semiconductor substrate. There is a plurality of cross-arranged active areas AA designed in the layout. Each active area AA is isolated by an isolation structure, e.g. a shallow trench isolation (STI). A plurality of parallel control gates GC is formed on the semiconductor substrate. Each couple of the control gates GC is arranged on the active areas AA in the same column. The conductive contact structure of the present invention including the contact plug HB is formed at the location upon the active areas AA between two control gates GC to electrically connect the active area AA to a conductive structure on the contact plug HB, such as a bit line.

Figure 2A:
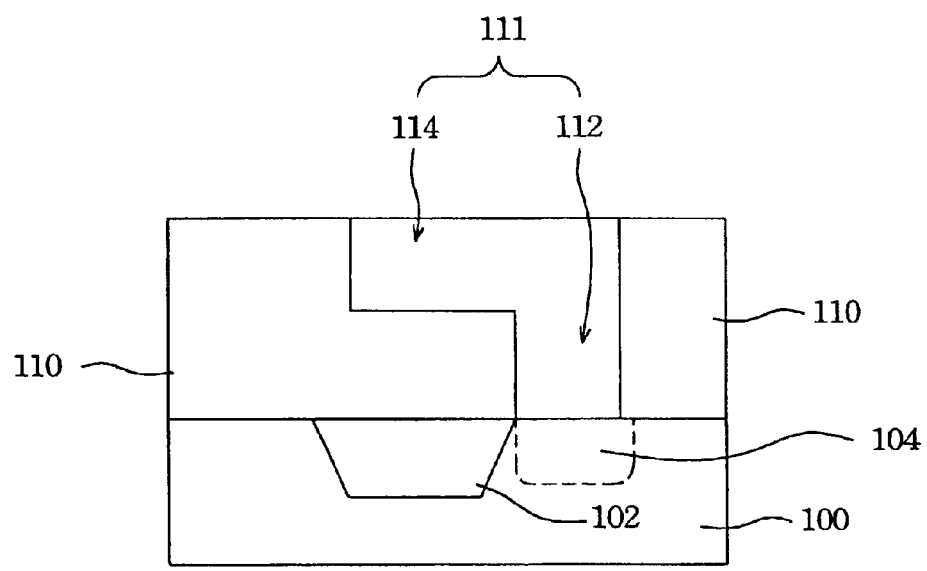
FIGS. 2A–2D are schematic, cross-sectional views according to one preferred embodiment of the present invention.

In the following description, the conductive contact structure and process of the present invention will be described. FIGS. 2A–2D are schematic, cross-sectional views of the conductive contact structure corresponding to the cross-sectional line I—I of FIG. 1 according to one preferred embodiment of the present invention. Referring to FIG. 2A, a semiconductor substrate 100, such as a silicon substrate with a <100> lattice orientation, is provided. An isolation structure 102, such as a shallow trench isolation (STI), is formed in the substrate 100 to zone the active areas AA (i.e. the active areas of FIG. 1). The center portion of the active area AA between the control gates GC is planned to serve as a source/drain region 104. After completing the manufacture process of the transistor device including the control gates GC and source/drain regions 104, a dielectric layer 110 is formed to cover the substrate 100. The dielectric layer 110 can be made of, for example, silicon oxide or other materials with low dielectric constant, and be formed by, for example, chemical vapor deposition (CVD), spin-on coating, etc.

An inlay opening including a pad opening 114 in the top and a bottom opening 112 in the bottom is formed in the dielectric layer 110. The bottom opening 112, for example, is a columnar opening and exposes the source/drain region 104. The pad opening 114, such as a bar opening, is larger than the bottom opening 112. The pad opening 114 has a width substantially similar to that of the bottom opening 112 and has a length longer than the bottom opening 112. The bottom of the pad opening 114 is connected to the bottom opening 112, and extended upon the isolation structure 102 adjacent to the source/drain region 104. The pad opening 114 and the bottom opening 112 construct an inlay opening 111. The method of forming the inlay opening can be the following exemplary steps, but not be limited herein. For example, a transient opening similar to the bottom opening 112 is formed at the location where the bottom opening 112 is determined. A photoresist layer having a pattern of the pad opening 114 is then formed on the dielectric layer 110 to define to pad opening 114. The exposed portion of the dielectric layer 110 is removed by such as ion reactive etching (RIE) to form the pad opening 114, and simultaneously the bottom of the transient opening is etched until the source/drain region 104 is exposed to form the bottom opening 112. The depth of the pad opening 114 can be optimized by controlling the depth of the transient opening and the etching time. Since the portion of the dielectric layer 110 under the pad opening 114 is left, the isolation between the control gates GC can be improved and thus the coupling capacitance can be reduced.

Figure 2B:
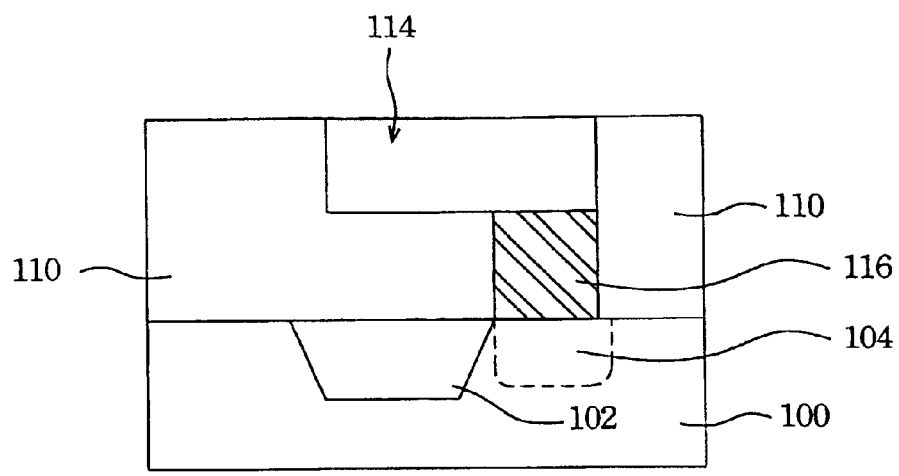

Referring to FIG. 2B, the bottom opening 112 is then filled with a polysilicon layer to form a bottom plug 116 electrically connected to the source/drain region 104. The manufacture process for the bottom plug 116 can be, for example, depositing a layer of polysilicon to fill the pad opening 114 and the bottom opening 112, and then etching back to leave the required portion in the bottom opening 112. The portion of the dielectric layer 110 in the bottom of the pad opening 114 can be a layer to detect etching stop point.

Figure 2C:
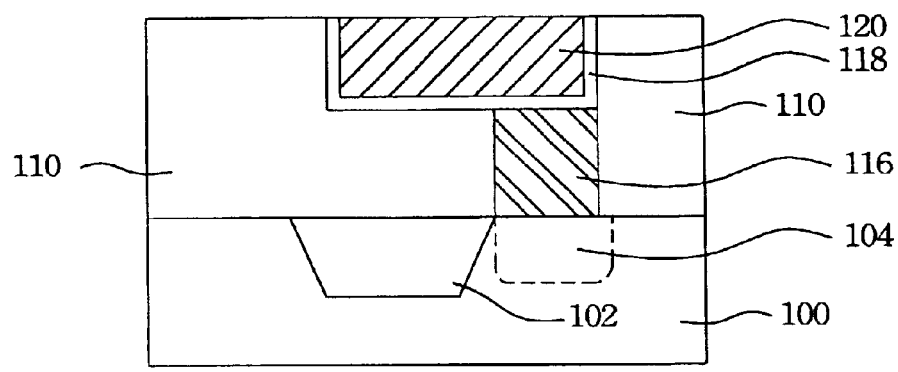

Referring to FIG. 2C, the pad opening 114 is then filled with a metal layer to form a metal pad layer 120. Before infilling the metal layer, a thin barrier layer 118, such as a titanium/titanium nitride (Ti/TiN) layer or a Ti/TiN/Ti layer, for defending moisture from the dielectric layer or thermal migration of the metal layer, is conformally formed inside the pad opening 114. If the barrier layer 118 has a bottom titanium layer, titanium silicide (TiSix) will be formed in the interface to reduce contact resistance. The metal layer is preferably a tungsten (W) layer. The metal pad layer 120 can be fabricated by, for example, depositing a layer of tungsten to fill the pad opening 114 and then etching back to leave the required portion, or by using a selective tungsten deposition. If the metal pad layer 120 is made of tungsten (having a resistivity lower than polysilicon), the effective resistance of the contact structure will be decreased to improve driving current.

Figure 2D:
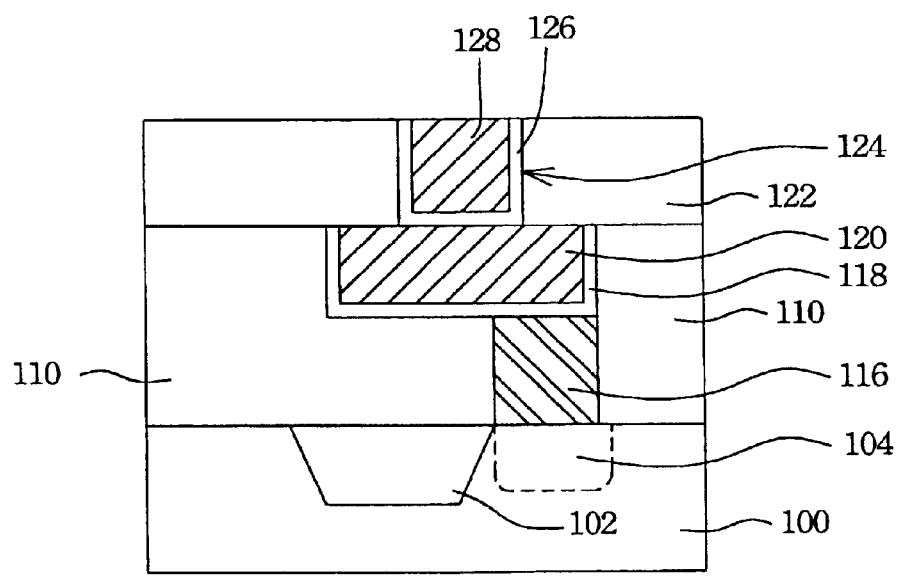

Referring to FIG. 2D, another dielectric layer 122 is formed on the dielectric layer 110. The dielectric layer 122 can be made of silicon oxide or other materials having a low dielectric constant and can be formed by chemical vapor deposition (CVD) or spin-on coating, etc. A top opening 124 is then formed in the dielectric layer 122 corresponding to the location of the contact plug HB in FIG. 1. The top opening 124 is aligned to the metal pad layer 120, i.e. the location of the pad opening 114, and exposes a portion of the metal pad layer 120. The top opening 124 is at the location substantially shifted away from the bottom plug 116, i.e. shifted away from the bottom opening 112. The top opening 124 is columnar opening and has a length shorter than the metal pad layer 120. Therefore, a larger process window can be obtained during the photolithography process of the top opening 124, so that the tolerance of misalignment errors can be improved, and thus yield losses are reduced.

After the resulting structure is formed, the top surface of the wafer will be naturally oxidized by the oxygen of the air to form an oxide, since the wafer is unavoidably exposed to the air during the process of transmission. The exposed portion of the metal pad layer 120 under the top opening 124 will be naturally oxidized to form a metal oxide on the top surface, such as a tungsten oxide. Since the remover for the metal oxide will not corrode the silicon oxide or silicon-based material, the dielectric layer 122 neighboring the top opening 124 will not be encroached, so the size of the top opening 124 will not be changed. Therefore, the size of the subsequently formed plug by filling the top opening 124 with a metal material is fixed to prevent a short to adjacent conductive structure caused from a size change of the top opening 124.

The top opening 124 is then filled with a metal layer to form a top plug 128 electrically connected to the metal pad player 120. Before infilling the metal layer, a thin barrier layer 126, such as a Ti/TiN layer or a Ti/TiN/Ti layer, for restricting moisture from the dielectric layer 122 or thermal migration of the metal layer, is conformally formed inside the top opening 124. The metal layer can be made of a material selected from the group of titanium, tungsten, aluminum, copper, silver, gold and an alloy thereof. The top plug 128 can be fabricated by, for example, depositing a layer of metal to fill the top opening 124 and then etching back to the required portion in the top opening 124. Since the metal pad layer 120 has a low resistivity, the current from the top plug 128 is facilitated to pass through the metal pad layer 120 to the bottom plug 116 and the source/drain region 104, and the operation speed of the device is therefore improved.

Thereafter, a metal line or other conductive structure, such as a bit line, a capacitor, etc., is formed on the top plug 128 to electrically connect to the top plug 128. For example, if a metal line is formed, the metal line and the top plug 128 can be formed integrally or separately. If the metal line and the top plug 128 are integrally formed, the fabricating process can be, for example, forming a metal layer on the dielectric layer 122 to fill the top opening 124. The metal layer is then defined to obtain the desired pattern of the metal line by conventional photolithography and etching processes. If the metal line is individually formed, the fabricating process of that is well known to a person of ordinary skill in the art, and thus is not further described herein.

According to above description, the present invention provides a conductive contact structure and process. The metal pad layer is inserted between the bottom and top plugs to form a stacked contact structure of the metal pad layer and conductive plugs. The process window of alignment during the photolithography process can be increased and the aspect ratio of the contact openings can be decreased, so the process difficulty can be reduced. Moreover, by using the metal pad layer, the total resistance can be decreased.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method of fabricating a conductive contact structure for electrically connecting to a source/drain region in a semiconductor substrate having a first dielectric layer thereon covering said source/drain region, comprising the steps of:
   forming a pad opening and a bottom opening in said first dielectric layer, said pad opening being larger than and located upon said bottom opening which is exposed to said source/drain region;
   forming a polysilicon layer to fill said bottom opening;
   forming a first metal layer to fill said pad opening;
   forming a second dielectric layer on said first dielectric layer;
   forming a top opening in said second dielectric layer, said top opening being smaller than and located upon said pad opening, said top opening being substantially shifting away from said bottom opening; and
   forming a second metal layer to fill said top opening.

2. The method according to claim 1, wherein said pad opening is extended upon an isolation structure adjacent to said source/drain region.

3. The method according to claim 1, wherein said metal layer comprises a tungsten layer.

4. The method according to claim 1, further comprising forming a thin barrier layer inside said pad opening before forming said first metal layer to fill said pad opening.

5. The method according to claim 1, wherein a material of said second dielectric is selected from the group consisting of titanium, tungsten, aluminum, copper, silver, gold and the combinations thereof.

6. The method according to claim 1, wherein the step of forming a polysilicon layer to fill said bottom opening comprises the steps of:
   filling said bottom opening and said pad opening with a polysilicon material; and
   removing said polysilicon material in the pad opening by etching back said polysilicon material with an end point at said first dielectric layer to form said polysilicon layer in said bottom opening.

7. A conductive contact structure in a dielectric layer located on a semiconductor substrate to electrically connect to a source/drain region in said semiconductor substrate, comprising:
   a bottom plug disposed on and electrically connected to said source/drain region;
   a metal pad layer disposed on said bottom plug being larger than said bottom plug and electrically connected to said bottom plug;
   a thin barrier layer between said metal pad layer and said dielectric layer; and
   a top plug disposed on and electrically connected to said metal pad layer and said top plug being substantially shifted away from said bottom plug.

8. The structure according to claim 7, wherein a material of said bottom plug comprises polysilicon.

9. The structure according to claim 7, wherein said metal pad layer is extended upon an isolation structure adjacent to said source/drain region.

10. The structure according to claim 7, wherein a shape of said metal pad layer comprises a bar.

11. The structure according to claim 7, wherein a material of said metal pad layer comprises tungsten.

12. The structure according to claim 7, wherein a material of said top plug is selected from the group of titanium, tungsten, aluminum, copper, silver, gold and the combinations thereof.

13. A conductive contact structure in a dielectric layer located on a semiconductor substrate to electrically connect to a conductive region in said semiconductor substrate, comprising:
   a bottom plug disposed on and electrically connected to said conductive region;
   a metal pad layer disposed on said bottom plug being larger than said bottom plug and electrically connected to said bottom plug; and
   a thin barrier layer between said metal pad layer and said dielectric layer.

14. The structure according to claim 13, wherein a material of said bottom plug comprises polysilicon.

15. The structure according to claim 13, wherein said metal pad layer is extended upon an isolation structure adjacent to said conductive region.

16. The structure according to claim 13, wherein a shape of said metal pad layer comprises a bar.

17. The structure according to claim 13, wherein a material of said metal pad layer comprises tungsten.

18. The Structure according to claim 13, further comprising a metal plug disposed on and electrically connected to said metal pad layer and said metal plug being substantially shifted away from said bottom plug.

* * * * *